Figure 1:
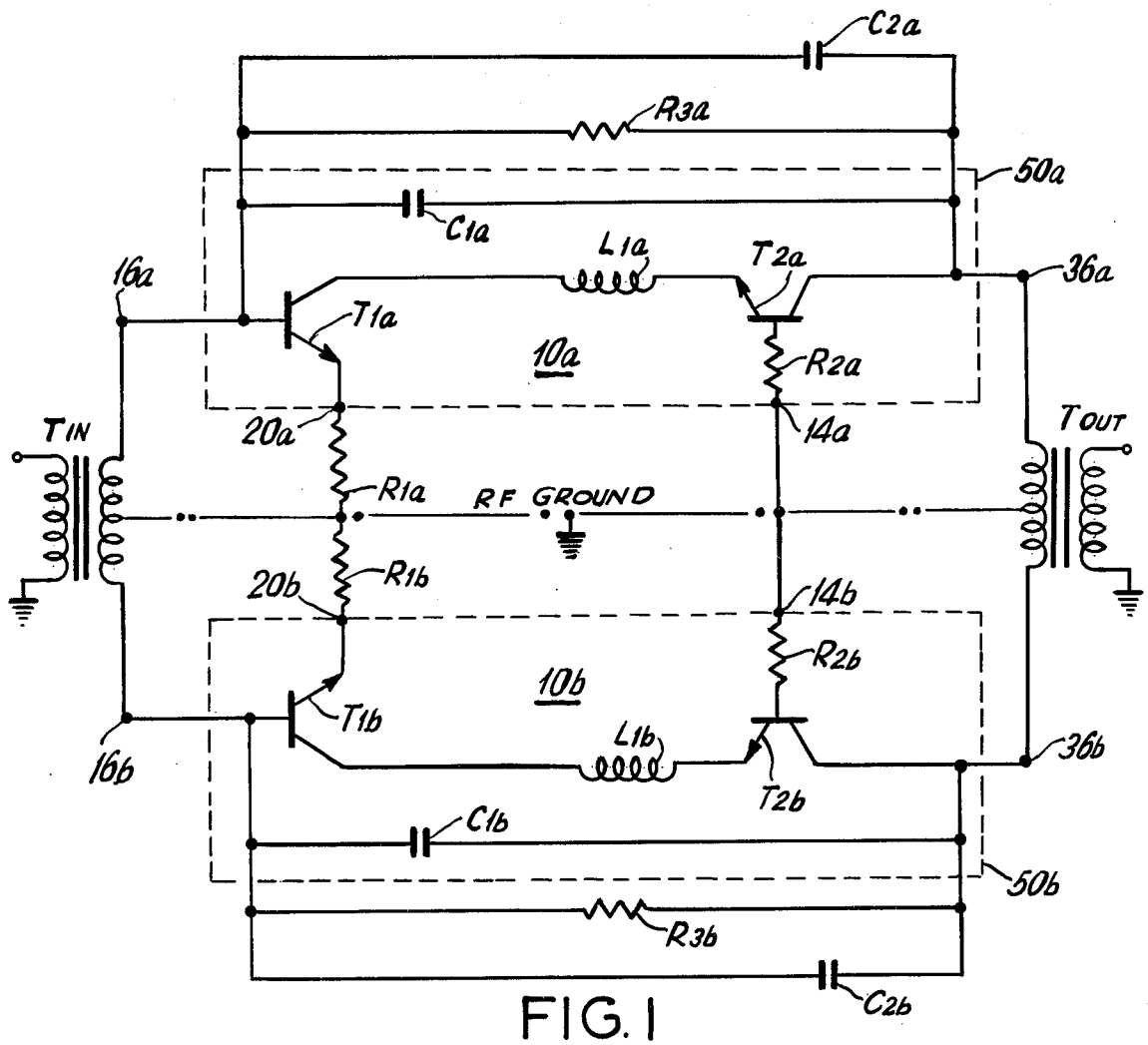

United States Patent [19]

Everhart et al.

[11] 4,112,386
[45] Sep. 5, 1978

[54] MODULAR RADIO FREQUENCY AMPLIFIER HAVING A GAIN VARIABLE BY EXTERNAL PASSIVE COMPONENT SELECTION

[75] Inventors: Norman Everhart, Richboro; Dieter Bruno Brauer, Hatboro, both of Pa.

[73] Assignee: Jerrold Electronics Corp., Hatboro, Pa.

[21] Appl. No.: 768,415

[22] Filed: Feb. 14, 1977

[51] Int. Cl.² ............................................. H03F 3/26
[52] U.S. Cl. ..................................... 330/265; 330/81; 330/262; 330/276; 330/302; 330/307; 330/311
[58] Field of Search ...................... 357/51; 330/77, 81, 330/83, 100, 103, 262, 265, 276, 294, 302, 307, 311

[56] References Cited

U.S. PATENT DOCUMENTS

| | | | |
|---|---|---|---|
| 2,812,390 | 11/1957 | Van Overbeek | 330/21 |
| 3,344,283 | 9/1967 | Stubbs | 330/103 X |
| 3,641,452 | 2/1972 | Steed | 330/302 X |
| 3,683,289 | 8/1972 | Rogers | 330/15 |
| 3,895,306 | 7/1975 | Rebeles | 330/20 X |
| 3,949,306 | 4/1976 | Watanabe et al. | 330/307 X |

OTHER PUBLICATIONS

"Basic Processes"—*Motorola Monitor*, pp. 8–16, vol. 2, No. 4, 6/1964.

*Primary Examiner*—Lawrence J. Dahl

[57] ABSTRACT

A broad-band radio-frequency amplifier is characterized by a gain which may be adjusted over a relatively large range, and which remains stable over the range of gain adjustments. The amplifier includes first and second transistor pairs each arranged in a cascode connection; a feedback capacitor connected across the output and input of each cascode pair; and inductance serially included at selected circuit points. Also disclosed is a hybrid circuit for efficiently implementing the amplifier.

7 Claims, 2 Drawing Figures

MODULAR RADIO FREQUENCY AMPLIFIER HAVING A GAIN VARIABLE BY EXTERNAL PASSIVE COMPONENT SELECTION

It is thus an object of the present invention to provide a stable radio-frequency amplifier in which gain may be varied over a relatively wide range.

It is another object of the present invention to provide an adjustable-gain, low noise radio-frequency amplifier of the type described in which the input and output impedances remain substantially constant over a relatively wide range of gains.

To these ends, the present invention provides an amplifier circuit including, in each stage, two pair of cascode-connected transistors arranged in a push-pull configuration. By connecting a feedback capacitance between the output and input of each cascode pair, and employing distributed inductance, it has been found that the gain of the composite amplifier may be varied over a larger range than has heretofore been possible without adversely affecting amplifier stability, impedance, or noise properties.

According to another aspect of the present invention, the inductance and the feedback capacitance may be implemented by an arrangement of conducting paths disposed on a hybrid circuit substrate.

Figure 2:
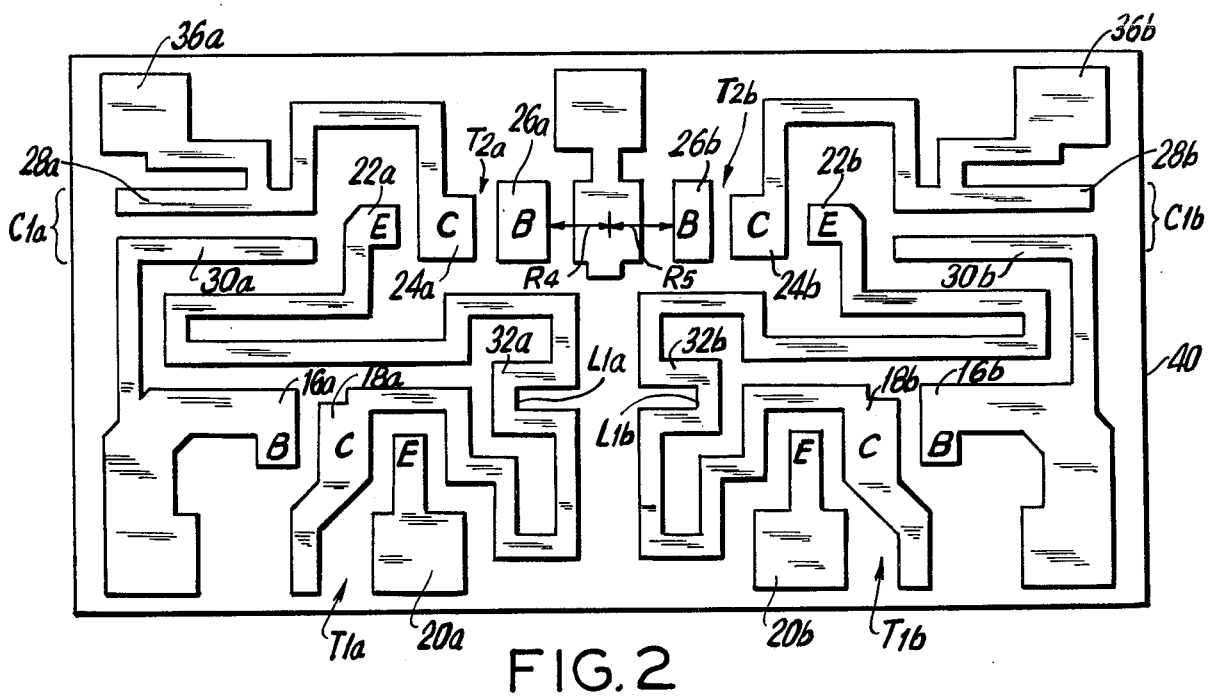

To the accomplishment of the above and of other objects as may hereinafter appear, the present invention relates to a radio-frequency amplifier as set forth in the appended claims, and as described in the following specification as considered with the accompanying drawing in which:

FIG. 1 is a schematic radio-frequency circuit diagram of an amplifier according to the principals of the present invention; and FIG. 2 is a plan view of a hybrid circuit substrate included in the amplifier circuit of FIG. 1.

Referring now to FIG. 1, there is shown an amplifier according to an embodiment of the present invention, which includes two push-pull cascode-connected amplifier sections 10a and 10b. In the following portion of the specification, a detailed description of one of the amplifier sections, in which components are assigned the postscript a, is given, it being understood that the other section, in which the components are assigned the postscript b, is substantially identical in all respects. Also, like reference numerals are used to identify like circuit points in FIGS. 1 and 2.

The representative cascode section 10a includes a transistor T1a connected for signal purposes in a grounded emitter configuration, having its collector connected to an emitter of transistor T2a arranged in a grounded base mode. The transistors T1a and T2a and similarly connected transistors T1b and T2b, are thus disposed in the per se conventional low noise, high gain cascode configuration. Inductance L1a,b and capacitors C1a,b are employed to stabilize each cascode amplifier 10a,b over a relatively wide range of operative gain selections.

DC biasing structure for the cascode amplifier sections may be effected by connecting a positive potential to the collector of transistors T2a and T2b at 36a,b, and a negative relative potential connected via series resistors to the emitters of the transistor T1a and T1b at points 20a,b. Base bias for transistors T1a, T1b, T2a, and T2b may be of many types (e.g., via by-passed to A.C. ground series) connected to the transistors at 14a,b and 16a,b.

For signal input purposes, the secondary winding of an input transformer Tin is connected to the base of transistors T1a and T1b, and the primary winding of an output transformer Tout is connected between the collectors of the transistors T2a and T2b. Thus, the cascode amplifier sections 10a and 10b are connected in push-pull fashion between an input signal-receiving primary of the input transistor Tin and a signal receiving element connected to the secondary winding output transformer Tout.

A negative feedback resistor R3a is connected between the output and input of the cascode amplifier section 10a to reduce the gain thereof from an open loop value to a lesser level. Similarly a feedback resistor R3b is employed to reduce the gain of the amplifier section 10b from its open loop value. The capacitors C2a and C2b act as further, frequency dependent negative feedback elements.

In accordance with one aspect of the principle invention, the elements shown within the rectangles 50a and 50b in FIG. 1 (each schematically at R.F. depicting one cascode half of a composite push-pull amplifier) are formed as a single integrated circuit, or mounted on a single hybrid circuit substrate (see FIG. 2). The net gain effected by the basic hybrid circuit cascode push-pull amplifier is then reduced to the value desired by the appropriate selection and connection of feedback elements, R1a,b, R3a,b and C2a,b. In particular, the net overall gain of the amplifier of FIG. 1 will be increased by increasing the value of resistors R3a,b while simultaneously decreasing the value of the resistor R1a,b and capacitors C2a,b.

Referring now to FIG. 2, there is shown an illustrative hybrid circuit substrate 40—which includes component mounting lands or pads, and inter-element conducting paths for securing and connecting the components included within the rectangle 50a and 50b of FIG. 1. The substrate 40 includes a transistor T1a mounting area, includes a base terminal contact region 16a, a collector contact region 18a, and an emitter contact region 20a. Similarly, transistor T1b land areas includes a base terminal contact region 16b, a collector contact region 18b, and an emitter region 20b. Transistor T2a,b receiving areas include emitter contact regions 22a,b, collector terminal regions 24a,b, and base engaging regions 26a,b.

Conduction strips 28a and 28b are respectively connected to and extend from collector contact regions 24a and 24b of transistors T2a and T2b, respectively. Strips 28a and 28b are respectively spaced from, and arranged substantially parallel to, conduction strips 30a and 30b which are respectively connected to, and extend from, base contact regions 16a and 16b for transistors T1a and T1b. The parallel pairs of conduction strips 28a–30a and 28b–30b respectively establish therebetween the on-substrate stabilizing capacitances C1a and C1b which, as shown in FIG. 1, are connected betweeen the collectors and bases of transistors T2a and T1a, and the transistors T2b and T1b.

Also as shown in FIG. 2, serpentine-like conduction paths 32a and 32b respectively extend between collector region 18a for transistor T1a and the emitter region 22a for transistor T2a, and from the collector terminal region 18b for transistor T1b and the emitter region 22b of transistor T2b. The looping conduction paths 32a and 32b respectively produce the inductances L1a and L1b of the circuit of FIG. 1.

It will thus be appreciated from the foregoing description of an embodiment of the invention, that an amplifier provides a broad-band frequency response and in which gain may be modified by as much as 6db by varying certain of the circuit parameters without sacrificing or excessively modifying stability, input and output impedance, or frequency response of the amplifier. Since gain specifying components are located external to the basic amplifier hybrid circuit, changes in these components, with the corresponding gain modification for the overall amplifier, may be readily accomplished without requiring modification to the basic cascode amplifier sections 10a,b.

It will also be appreciated that although the amplifier of the invention has been hereinabove specifically described with respect to one embodiment thereof, modifications may be made therein without necessarily departing from the spirit and scope of the invention.

What is claimed is:

1. In combination in a radio frequency amplifier, first and second cascode amplifier stages each having an input and output port connected in push-pull arrangement; each of said first and second cascode amplifier stages included a first transistor connected in a grounded emitter mode and a second transistor connected in a grounded base mode, the collector of said first transistor in each of said first and second cascode amplifier stages being connected to the emitter of said second transistor therein included; each of said first and second cascode amplifier stages including first inductance means serially connected between the collector of said first transistor and the emitter of said second transistor further comprising a hybrid circuit substrate upon which are mounted said first and second transistors of each of said first and second cascode amplifier stages, said first inductance means in each of said cascode amplifier stages comprising an irregular, supertine conduction path formed of a conducting material mounted on said substrate connected to said transistor electrodes.

2. A combination as in claim 1 wherein each of said first and second cascode amplifier states further includes capacitor means directly connecting the collector of said second transistor to the base terminal of said first transistor.

3. A combination as in claim 2 further comprising negative feedback means for reducing the gain of each of said first and second cascode amplifier stages.

4. A combination as in claim 3 wherein said negative feedback means comprises a resistance connecting said input and output ports of each of said first and second cascode amplifier stages.

5. A combination as in claim 4 wherein each of said negative feedback means comprises capacitor means connected in parallel with said resistance.

6. A combination as in claim 5 further comprising input transformer means connected to said input ports of said first and second cascode amplifier stages, and output transformer means connected to said output ports of said first and second amplifier stages.

7. Combination as in claim 1 wherein said substrate includes thereon land areas connected to the base of said first transistor and said collector of said second transistor of each of said first and second cascode amplifier stages, said land areas including extending, non-contacting conduction paths extending therefrom into proximity with one another for forming capacitor means in each of said first and second cascode amplifier stages.

* * * * *